United States Patent
Valk et al.

(10) Patent No.: US 6,259,320 B1
(45) Date of Patent: Jul. 10, 2001

(54) ERROR CORRECTION WITHIN POWER AMPLIFIERS

(75) Inventors: Eric C. Valk, Nepean; Steve A. Beaudin, Ottawa; Johan M. Grundlingh, Kinburn, all of (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/472,911

(22) Filed: Dec. 27, 1999

(51) Int. Cl.[7] .................................................. H03F 1/26
(52) U.S. Cl. ........................ 330/149; 330/136; 330/151
(58) Field of Search ................................ 330/129, 136, 330/149, 151

(56) References Cited

U.S. PATENT DOCUMENTS

| 5,157,346 | 10/1992 | Powell et al. | 330/151 |
| 5,455,537 | 10/1995 | Larkin et al. | 330/52 |
| 5,489,875 | 2/1996 | Cavers | 330/151 |
| 5,699,383 | 12/1997 | Ichiyoshi | 375/297 |
| 5,802,451 | 9/1998 | Adachi et al. | 455/126 |
| 6,002,300 | * 12/1999 | Herbster et al. | 330/149 |
| 6,118,339 | * 9/2000 | Gentzler et al. | 330/149 |

OTHER PUBLICATIONS

Nick Pothecary; Feedforward Linear Power Amplifiers; 1999; pp. 25–42, 81–91, 113–143.

* cited by examiner

Primary Examiner—Steven J. Mottola
(74) Attorney, Agent, or Firm—Dennis R. Haszko; Smart & Biggar

(57) ABSTRACT

A feed forward power amplifier has a main amplifier and an error compensation path that compares the input and output of the main amplifier and subsequently adjusts the output signal from the main amplifier. Currently, such a design requires the implementation of a delay apparatus to delay the output of the main amplifier in order to compensate for the delay within the error compensation path. This delay apparatus implemented within a high-power area costs the power amplifier in terms of money, size, and/or efficiency. With the implementation of a phase compensation filter within the error compensation path, the delay apparatus can be removed. The phase compensation filter has a frequency versus phase characteristic with a positive slope for a limited bandwidth and a constant frequency versus gain characteristic. This allows, for the limited bandwidth, the characteristic of the error compensation path to be similar to that of the undelayed output of the main amplifier. The use of a phase compensation filter within a feedback power amplifier can also have benefits, as the bandwidth of the power amplifier can be expanded.

36 Claims, 13 Drawing Sheets

ERROR CORRECTION WITHIN POWER AMPLIFIERS

FIELD OF THE INVENTION

This invention relates generally to power amplifier designs and more specifically to error correction within power amplifiers.

BACKGROUND OF THE INVENTION

Power amplifiers are used within many communication apparatuses in order to raise to a high level the power of a signal that is to be transmitted. These power amplifiers can be designed to operate within a number of different classes, the class of operation referring to the conduction angle of the transistor(s) within the amplifier. The difference in conduction angle results in different output waveforms when an input signal is applied. The most important result of these different classes of operation concerns their affect on the linearity and efficiency of the power amplifier. In fact, one should understand that there is a trade-off between linearity and efficiency within amplifiers such that when linearity increases, efficiency decreases and vice versa.

Amplifiers that operate in Class A, those with a conduction angle of 360°, typically have good linearity, that being constant gain and delay over a wide range of frequencies and power, and low distortion, that being low harmonics and intermodulation products generated by the amplifier. The disadvantage of these Class A amplifiers is their poor efficiency. Theoretically, an amplifier operating in Class A can at most have a 50% efficiency. A Class A amplifier can be operated from almost zero output power to some maximum output power known as the saturation power. At very low levels of output power, the distortion is typically not measurable. As the output power approaches saturation power, the distortion increases and becomes very large when the saturation power is reached. Because a Class A amplifier uses almost a constant amount of DC supply power, the efficiency is almost zero at very low output powers and typically only approaches 50% when the distortion becomes significant.

Amplifiers operating in Class B, those having a conduction angle of 180°, have increased efficiency but a lower level of linearity than Class A. The maximum theoretical efficiency possible with this class of amplifier is 78%. The difficulty is that a Class B amplifier has distorted output, especially when the input signal is close to zero volts. Further classes of amplifiers (Classes C through F) with smaller conduction angles (<180°) are possible. These amplifiers each have further increased efficiencies at the expense of more distortion.

A compromise amplifier, that has lower distortion than a Class B amplifier but approximately the same efficiency, is a Class AB amplifier. Amplifiers operating in Class AB have a conduction angle larger than 180°, but lower than 360°. These amplifiers avoid some, but not all, of the distortion problems of the Class B amplifiers while maintaining most of the Class B amplifier's efficiency.

Techniques currently exist to reduce the distortion within Class AB amplifiers so that even applications that require high linearity can utilize them. These characteristics make Class AB amplifiers particularly appropriate for applications in which a reasonably high efficiency and low distortion are required. These same techniques can be used to reduce the distortion in Class A amplifiers operating near saturation power.

Some applications in which Class AB amplifiers have been previously implemented include communication apparatuses such as base stations. Some of the key factors that contribute to the overall cost and performance for base stations are the size, cost, and quality of their power amplifiers. Without the use of techniques to lower distortion as mentioned herein above, the quality of the output signals from Class AB power amplifiers and Class A amplifiers driven near saturation, is not satisfactory for base station applications. The use of Class A amplifiers at power levels significantly below saturation power, on the other hand, is typically unacceptable due to low efficiency.

One technique to reduce the distortion within an output signal of an amplifier 20 is the use of a feed forward error compensation path 22 as depicted within FIG. 1. In simplistic terms, such a path 22 generates an error signal by comparing a signal being input to an amplifier 20 and that being output from the amplifier, and then amplifying and filtering the result of the comparison to obtain the correction signal. By then adding the correction signal to the output of the amplifier 20, the error within the output signal (i.e. the distortion) as a result of the amplifier 20 can be reduced. The distortion is reduced because the distortion components in the correction signal are in antiphase with the distortion components in the signal at the output of amplifier 20 and of equivalent power to them after the addition process.

The delay caused by this feed forward path 22 is one of the key problems with this technique, as the correction signal can have the desired phase relationship with the output signal from the amplifier 20 only over a narrow frequency range; outside this range there is a phase error. This "phase error" decreases the effective correction that is obtained with use of the feed forward error compensation path. As the phase error increases, the error correction decreases to an extent such that when the phase error is at 60° there is no correction. If the phase error exceeds 60°, the "correction" makes the distortion worse.

The current method to overcome this delay problem is to use a delay line between the output of the amplifier 20 and the location in which the amplified error signal is being added to the output signal. If the length of the delay line is selected properly, the delay caused by the delay line will be equal to the delay caused by the feed forward error compensation path 22. There are a number of key problems with a setup such as this with a delay line. Firstly, the delay line is costly and relatively large, thus significantly increasing the cost and size of the overall power amplifier. Further, the delay line is implemented within a high power area of the power amplifier and results in attenuation of the amplified signal. This attenuation not only reduces the output power of the overall power amplifier requiring a larger amplifier 20 to get the same power, but also causes considerable heat dissipation. This heat dissipation must be compensated for with large and expensive heat sinks or otherwise, the resulting signal will have changes in phase and gain that lead to an even greater phase error.

An alternative to the delay line described above is a delay filter being used between the output of the amplifier 20 and the location in which the subtraction of the error signal occurs. Although this delay filter doesn't reduce the overall power or increase the overall size of the power amplifier as much as the delay line, these areas are still of concern. The amount of heat dissipated within the delay filter will be significant resulting in similar problems to that described for the delay line. One key disadvantage of using the delay filter is the components that must be used for this purpose. Since the delay filter is implemented at a high power area of the power amplifier, the delay filter would have to be implemented with large waveguide or discrete components, making the filter expensive, large and difficult to manufacture. These delay filters are simply impractical in cost-conscience power amplifier designs.

A second technique to reduce the distortion within an output of an amplifier 20 is to use a feedback error compensation path 24 as depicted within FIG. 2. With this technique, the input and output to the amplifier 20 are compared and the results are used to adjust the input to the amplifier 20. Many variations of this technique are possible. For example, the results can be proportional to magnitude and phase error and hence connected to a magnitude and phase adjuster. Alternatively, the results can be proportional to in phase and quadrature amplitude error, and hence connected to an in phase and quadrature amplitude adjuster. FIG. 2 shows two feedback paths, though in general there can be one or a plurality of feedback paths.

One key problem with the use of a feedback path 24 is the possibility of oscillations within the output signal due to the delay within the path itself. The delay results in a lag between the signals being compared and the error signal adjusting the input signal to compensate for distortion. The ideal phase shift within the error signal is 180° so that it subtracts the error signal from the input signal $S_{IN}(t)$. As the frequency increases, the lag increases the phase shift which eventually approaches a threshold near 360°. At this frequency, the output signal will oscillate if the loop gain is greater than one. These oscillations represent unacceptable instability. Filters are required to reduce the loop gain to less than unity before the phase threshold is reached. These filters also reduce the bandwidth over which correction is effective. Hence, this feedback technique has a significantly limited bandwidth for it to be used effectively, essentially limiting the bandwidth for the entire power amplifier to operate properly.

As described above, each of the currently well-known techniques to reduce the distortion within Class AB amplifiers implemented within base stations have cost, size, and/or bandwidth problems. Therefore, these techniques for reducing distortion must be improved to limit these problems so that a cheaper, smaller, higher efficiency, and/or higher bandwidth power amplifier can be developed.

SUMMARY OF THE INVENTION

The present invention is a modification to the previous feed forward and/or feedback error correction techniques used to decrease the distortion within a power amplifier. In embodiments of this invention, a phase compensation filter is placed either within a feed forward or feedback path of a power amplifier in order to reduce the affect the delays within the particular path have on the power amplifier as a whole. In the feed forward case, this phase compensation filter preferably replaces the need for a delay line or delay filter being placed after the output of the amplifier thereby increasing amplifier efficiency. In the feedback case, this phase compensation filter reduces the rate of change of phase shift with frequency thereby increasing the bandwidth in which the power amplifier can operate effectively.

The present invention, according to one broad aspect, is a power amplifier apparatus including a main amplifier that has an input and an output, the main amplifier amplifying signals that are received at the input while adding distortion components. Further, the power amplifier apparatus has first and second samplers, a comparator, a filter, an error amplifier and an injector. The first and second samplers are coupled to the input and output of the main amplifier respectively and generate first and second samples respectively. The comparator generates an error signal in response to the first and second samples. The filter, having a frequency versus phase characteristic with a positive slope over a limited bandwidth, filters the error signal. The error amplifier amplifies the filtered error signal. And finally, the injector combines a signal at the output of the main amplifier with the amplified error signal to generate an output signal for the power amplifier apparatus.

Preferably, the power amplifier apparatus further has a delay apparatus and an attenuator to generate a delayed version of the first sample and a low-power version of the second sample respectively. These versions are preferably used by the comparator to generate the error signal.

Further, the error compensation path preferably has a first amplitude and phase adjuster that adjusts the amplitude and phase of the error signal or the filtered error signal so that the error signal is substantially in antiphase to the distortion component of a signal at the output of the main amplifier. Yet further, there is preferably a second amplitude and phase adjuster coupled between the first sampler and the comparator for the purpose of adjusting the amplitude and phase of the first sample to be substantially in antiphase with non-distortion components of the second sample.

The present invention, according to a second broad aspect, a power amplifier apparatus including a main amplifier that has an input and an output, the main amplifier amplifying signals that are received at the input while adding distortion components. Further, the power amplifier apparatus has first and second samplers, a filter, a comparator, an error amplifier, and an adjuster. The first and second samplers are coupled to the input and output of the main amplifier respectively and generate first and second samples respectively. The filter has a frequency versus phase characteristic with a positive slope over a limited bandwidth, and filters the second sample. The comparator generates an error signal in response to the first sample and the filtered second sample. The error amplifier amplifies the error signal. And finally, the adjuster adjusts a signal at the input of the main amplifier in response to the amplified error signal.

In preferred embodiments, there are a plurality of comparators and error correction paths, each error compensation path comprising a further comparator and error amplifier. Each comparator is preferably designed to correct different aspects of the distortion components within the signals output from the main amplifier. For example, one path may be designed to correct slowly varying phase distortion, another fast changing phase distortion, and yet others to correct, slowly varying and/or fast changing amplitude distortion or in phase and/or quadrature distortion. Further, within each error compensation path there is preferably a bandpass filter, low pass filter or integrator.

Yet further, there is preferably an amplitude and phase adjuster between the first sampler and the comparator which is preferably used to ensure that the first and second samples input to the comparator or comparators are substantially equal in amplitude and in phase.

Alternative implementations include rearranging the components within the power amplifier apparatus including implementing the filter after the error amplifier and rearranging the location of the amplitude and phase adjusters.

Within preferable embodiments, the filter is a Surface Acoustic Wave filter that has a temperature detector and adjuster to maintain the filter at a constant temperature.

The present invention, according to a third broad aspect, is a method of reducing the affect of distortion components generated within a main amplifier. The method includes comparing an input and an output of the main amplifier to generate an error signal, compensating for a portion of the frequency versus phase characteristic caused by a delay in generating the error signal, and adjusting the input or the output of the main amplifier as a result of the error signal.

The present invention, according to a fourth broad aspect, is a power amplifier apparatus comprising a main amplifier comprising an input and an output, the main amplifier amplifying signals that are received at the input while adding distortion components. Further, the power amplifier apparatus comprises means for comparing the input and output of the main amplifier to generate an error signal, means for compensating for a portion of a frequency versus phase characteristic caused by a delay in generating the error signal, and means for adjusting one of the input and the output of the main amplifier as a result of the error signal.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

The preferred embodiment of the present invention is described with reference to the following figures, in which.

DETAILED DESCRIPTION OF THE PREFERRED EMBODIMENT

Figure 1:
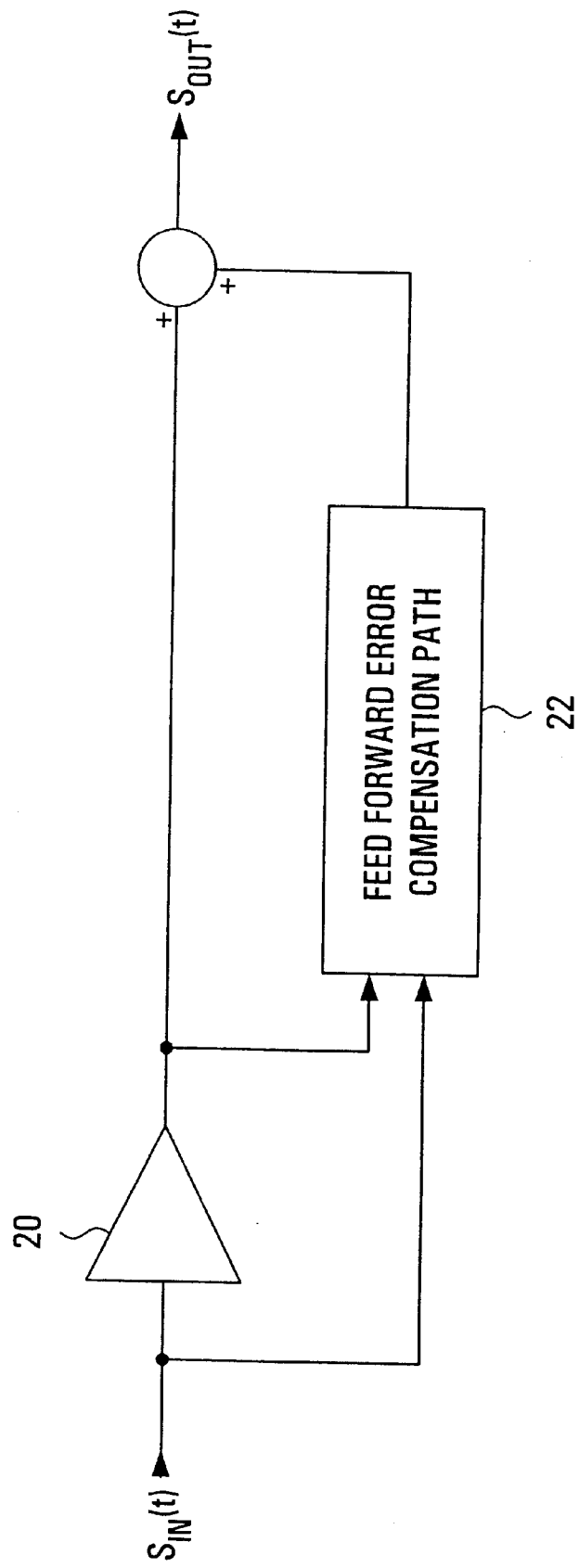
FIG. 1 is a simplified block diagram of a well-known feed forward power amplifier configuration.
Figure 2:
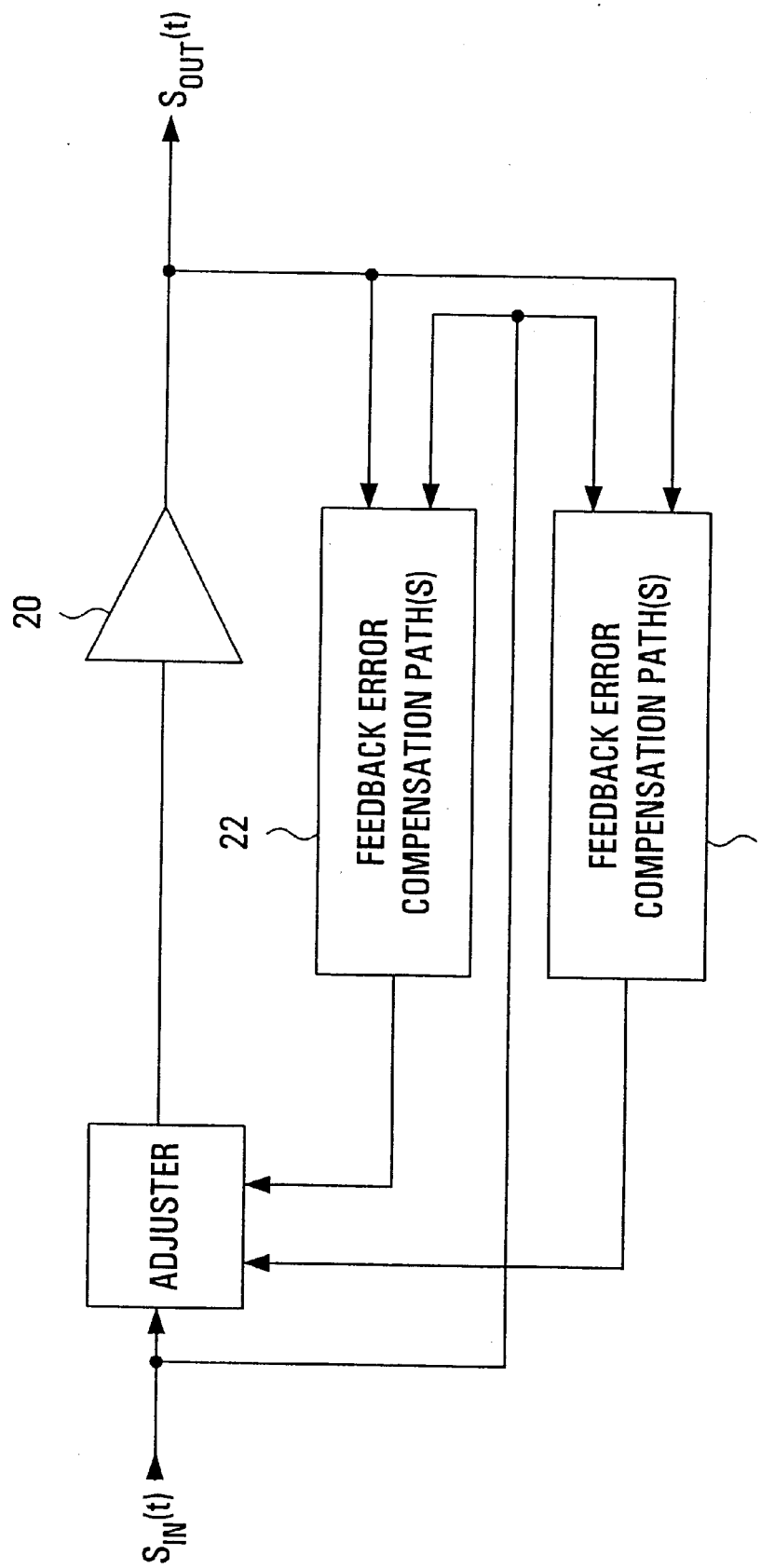
FIG. 2 is a simplified block diagram of a well-known feedback power amplifier configuration.

The present invention is directed to numerous different embodiments for a power amplifier configuration that utilizes a phase compensation filter in order to mitigate disadvantages found in previously well-known implementations. In one preferred embodiment, the phase compensation filter, that will be described herein below in detail, is inserted within a feed forward error compensation path. The insertion of this filter reduces the negative affect the delay has on the overall power amplifier and preferably removes the need for a delay line or delay filter as previous designs require. This can increase the efficiency and output power of the power amplifier overall. In a second preferred embodiment, the phase compensation filter is inserted within a feedback path such that the negative affect of the delay within the feedback path is reduced. This can increase the effective bandwidth of the power amplifier overall.

First, a well-known feed forward configuration will be described in detail with reference to FIG. 3, followed by a description of a feed forward configuration according to a preferred embodiment with reference to FIG. 5. Within FIG. 3, a main amplifier 20 is used for the amplifying of an input signal $S_{IN}(t)$ that results in distortion being added to the amplified signal. It can be seen that the overall apparatus depicted in FIG. 3 has input and output nodes 70,72 that have the main amplifier 20 coupled between. With the feed forward setup of FIG. 3, samples of the signals input and output to/from the main amplifier 20 (for example as seen in spectrums on FIGS. 4A and 4B respectively) are taken with use of input and output samplers 26,28 respectively. The sample of the output signal is attenuated with attenuator 30 to reduce the amplitude of the information component of the sample to a level consistent with that within the input signal. The sample of the input signal is delayed with delay line 29 and input to an amplitude and phase adjuster 31. The delay line 29 is designed to cause a delay in the sample of the input signal that matches the delay experienced by the sample of the output signal due to the main amplifier 20 and the attenuator 30. The amplitude and phase adjuster 31 is controlled so that the sample of the input signal has an amplitude and phase that is substantially in antiphase with the non-distortion component of the sample of the output signal. Subsequently, the attenuated sample of the output signal is then compared with the adjusted sample of the input signal at comparator 32 to generate a low power error signal which preferably comprises the output signal with the input signal substantially eliminated, leaving only the distortion component of the output signal. An example of a low power error signal possible for the input and output signals shown in FIGS. 4A and 4B respectively is depicted in a spectrum on FIG. 4C. It can be seen that this spectrum only includes the distortion portion of the output signal from the amplifier 20.

The low power error signal is next input to an amplitude and phase adjuster 34 which is controlled so that the amplitude and phase of the error signal is in antiphase with the distortion component of the signals output from the main amplifier 20. The adjusted signal is subsequently amplified by an error amplifier 36 to generate a high power error signal. As can be seen on FIG. 3, the high power error signal is next combined with use of an injector 38 with a delayed version of the output signal from the main amplifier 20, the delay being caused by a delay line 40. In this case, the delay line 40 is designed to match the delay caused by the attenuator 30, comparator 32, amplitude and phase adjuster 34, and error amplifier 36. The combination at the injector 38 is essentially a subtraction of the high power error signal from the output signal of the main amplifier 20 due to the phase adjustment within the error signal at the amplitude and phase adjuster 34 causing the error signal to be in antiphase with the distortion components in the output signal. Ideally, the resulting signal from the injector 38 is an output signal $S_{OUT}(t)$ at the output node 72 which has most of the distortion caused by the main amplifier 20 removed. The error amplifier 36 for this setup is typically a Class A amplifier to minimize the distortion, since any distortion created by the error amplifier 36 is directly added to the output signal $S_{OUT}(t)$.

Figure 3:
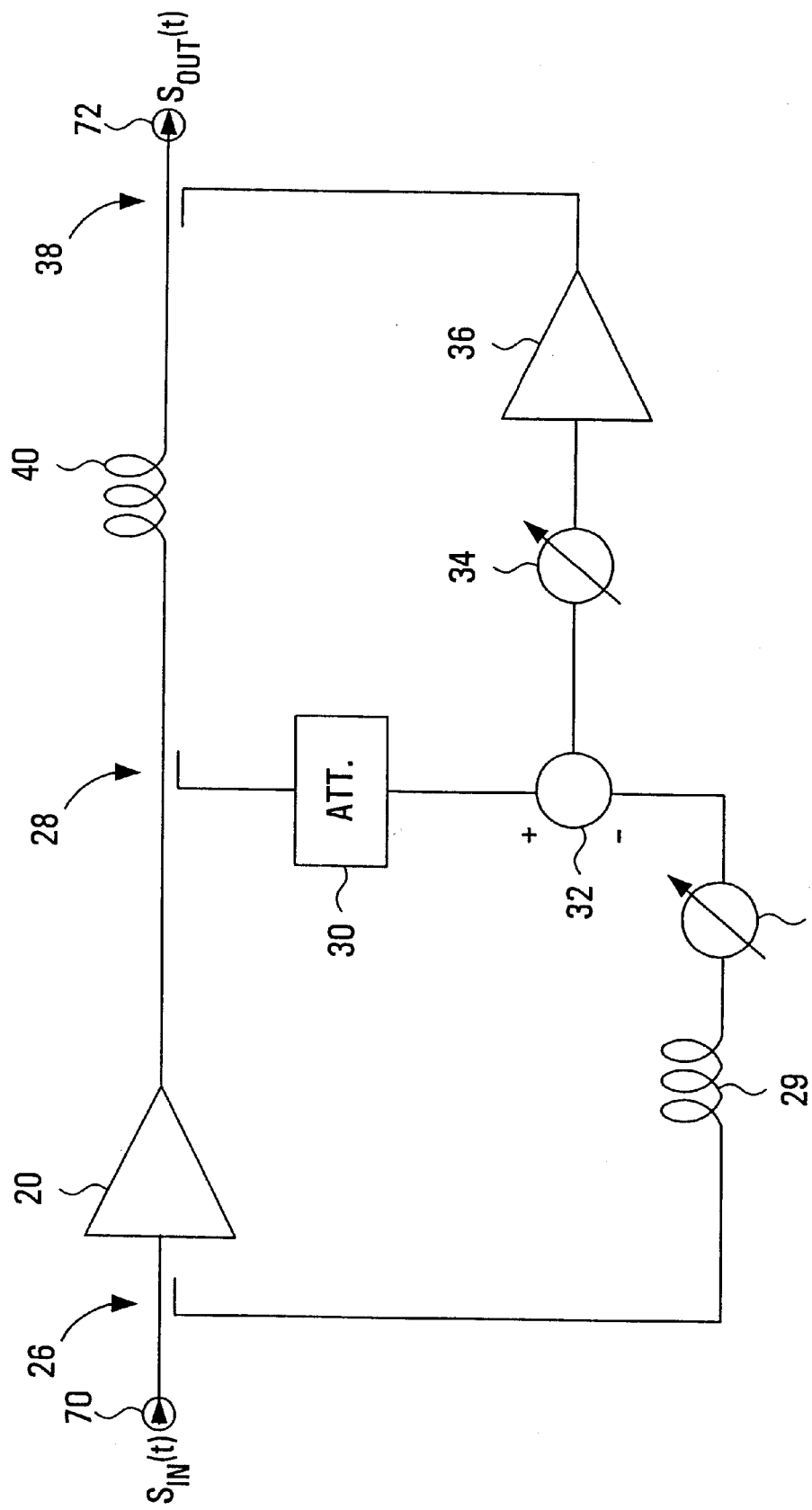
FIG. 3 is a block diagram of a well-known feed forward power amplifier configuration.
Figure 4A:
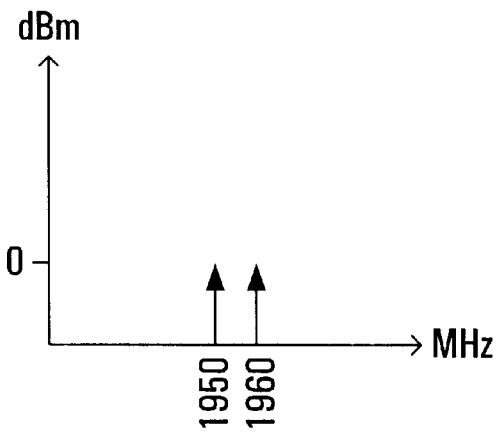
FIGS. 4A, 4B and 4C are sample spectrums illustrating a possible input and output signal to/from a main amplifier and a possible error signal respectively.
Figure 4B:
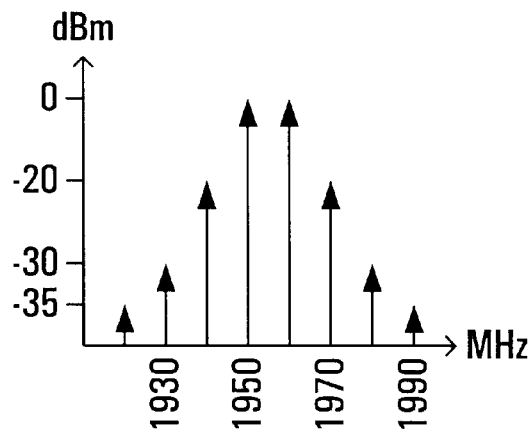
Figure 4C:
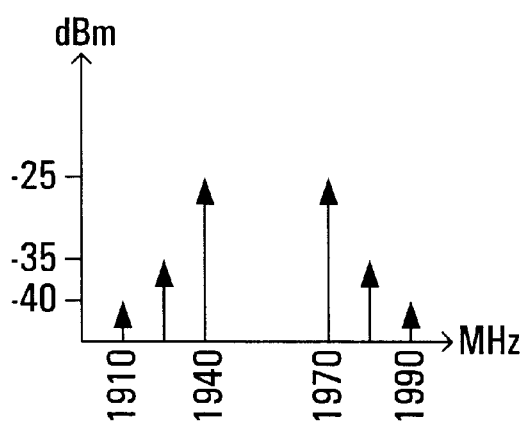

One key problem as stated previously with this feed forward configuration depicted within FIG. 3 is with the use of the delay line 40. The cost and size of the delay line 40 are key disadvantages that directly result in the power amplifier being of higher overall cost and size. Further, the delay line attenuates the output signal from the main amplifier 20 such that the resulting output signal $S_{OUT}(t)$ from the power amplifier apparatus is reduced and the heat that must be dissipated from the power amplifier increases.

A power amplifier with feed forward error compensation, according to a preferred embodiment of the present invention, is now described with reference to FIG. 5. This embodiment is similar to the well-known implementation as shown in FIG. 3 except for the addition of a phase compensation filter 42 within the feed forward path between the adjuster 34 and the error amplifier 36. The addition of this phase compensation filter 42 can allow for the removal of the delay line 40 as will be described herein below.

The phase compensation filter 42 is a specific type of filter that has, within a limited bandwidth, phases of increasing value while the frequency increases. This type of filter is sometimes referred to as a negative delay filter since having an increasing (less negative) phase as the frequency increases effectively makes a signal path appear to have a lower delay within this limited bandwidth. Currently, filters with this phase compensation characteristic are utilized within satellite systems in order to compensate for a filter with a poor phase characteristic.

Figure 5:
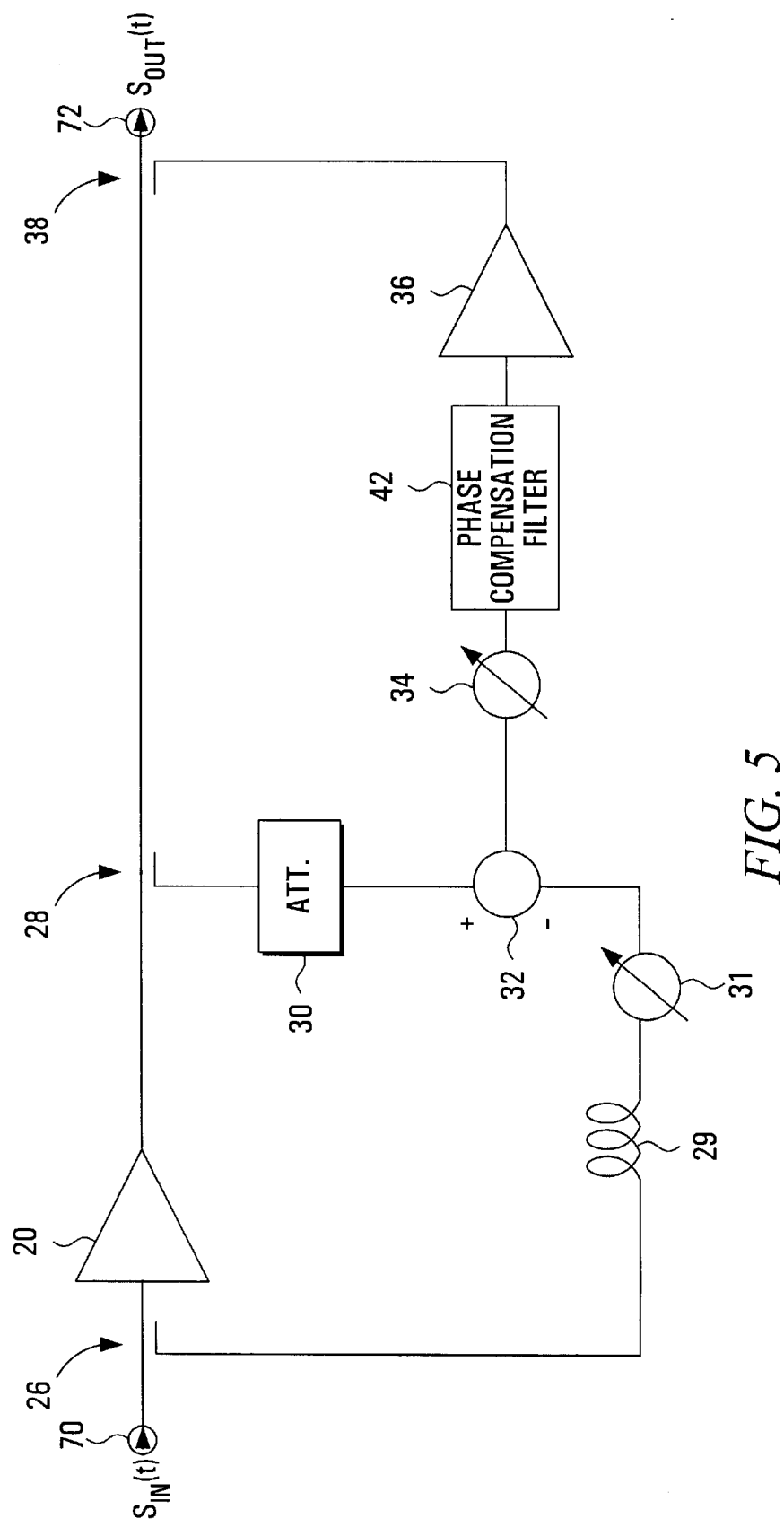
FIG. 5 is a block diagram of a feed forward power amplifier configuration according to a preferred embodiment of the present invention.
Figure 6:
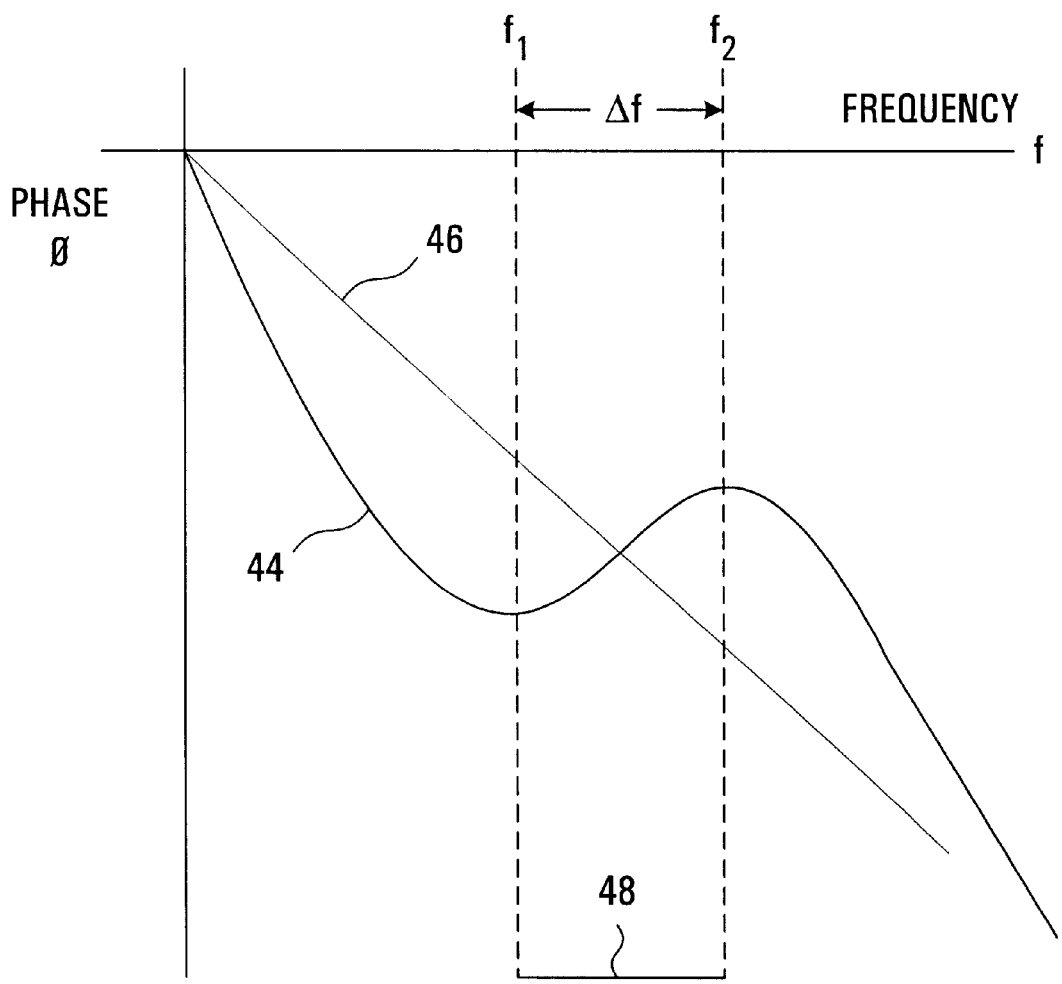
FIG. 6 is a frequency versus phase shift graph depicting characteristics corresponding to components within FIG. 5.

Possible frequency versus phase graphs for different components within FIG. 5 are shown in FIG. 6. In this figure, a first curve 44 on the graph represents a possible frequency versus phase characteristic of the phase compensation filter 42 while a second curve 46 represents a possible frequency versus phase characteristic of the remaining components within the feed forward error compensation path (i.e. the amplitude and phase adjuster 34, the attenuator 30, comparator 32 and the error amplifier 36). It can be seen that within frequencies $f_1$ through $f_2$ on the first curve 44, the phases are of increasing value (decreasing negative value). The bandwidth $\Delta f$ ($f_1$ through $f_2$) in which this occurs is limited, with the surrounding frequencies having phases of decreasing values (increasingly negative values) when the frequency increases. For the second curve 46, there is a decreasing phase for an increasing frequency throughout. Within the bandwidth $\Delta f$, the slope of the two curves 44,46 are approximately equal but opposite. Hence, within this bandwidth $\Delta f$, the overall frequency versus phase characteristic for the entire feed forward error compensation path would be approximately horizontal as seen at line 48. Outside of this specific bandwidth $\Delta f$, the characteristic would not be horizontal and in fact would have a more negative slope than either of the two curves 44,46 have independently.

It is noted that the frequency versus gain characteristic for the entire error compensation path is preferably essentially constant over the desired bandwidth. In the case that it is not essentially constant prior to adding the phase compensation filter 42, preferably the filter 42 has a frequency versus gain characteristic that compensates for the frequency versus gain characteristic of the other components over the desired bandwidth. In the case that the frequency versus gain characteristic of the error compensation path is essentially constant over the desired bandwidth prior to the addition of the phase compensation filter 42, preferably the filter 42 also has a frequency versus gain characteristic essentially constant over the particular bandwidth. In alternative embodiments, a further component (not shown), such as an additional filter, is included within the error compensation path to compensate for the frequency versus gain characteristic of the components of the error compensation path including the phase compensation filter 42.

In preferred embodiments, the bandwidth comprising virtually horizontal phase and amplitude characteristics includes and exceeds the bandwidth of the high power error signal. After considering a wrapping of the phases, it can be seen that the phase of the overall feed forward error compensation path is approximately 180°. Hence, the high power error signal output from the error amplifier 36 will be essentially in antiphase with the distortion components in the undelayed signal being output from the main amplifier 20 when they are combined at the injector 38.

In previous designs, as described herein above, a delay line or delay filter is inserted between the output sampler 28 and the injector 38. These added components have a frequency versus phase characteristic similar to the second curve 46 on FIG. 6, hence adjusting the phase of the output signal from the main amplifier 20 in a similar fashion to the well-known feed forward error compensation path. This results in the two signals being input to the injector being virtually in antiphase. One key advantage of the preferred embodiment of the present invention depicted within FIG. 5 is that no delay line or delay filter is required to ensure that the inputs to the injector 38 remain in antiphase over a wide frequency range. The use of a delay line or delay filter, within the high power area between the output sampler 28 and the injector 38, is costly as described previously in terms of money, space, loss in output power (between $10/W and $100/W), and heat dissipation.

Some previous implementations did not utilize either a delay line or a delay filter. In these cases, the useable bandwidth of the power amplifier is very small due to the signals combined at the injector 38 being in antiphase only over a narrow frequency band. The use of the present invention, rather than this previous design, has the advantage of a larger useable bandwidth, that being a useable bandwidth $\Delta f$ in which the combined signals are virtually in antiphase due to the virtually horizontal phase characteristic within the feed forward error compensation path.

It is noted that, although the phase compensation filter 42 is placed between the adjuster 34 and the error amplifier 36 in the preferred embodiment depicted in FIG. 5, this is not meant to limit the scope of the present invention. The phase compensation filter 42 could alternatively be implemented before the amplitude and phase adjuster 34 or after the error amplifier 36. Preferably, as shown in FIG. 5, the phase compensation filter 42 is inserted within the feed forward path prior to the error amplifier 36 though in order that it be placed in a low power area. When the phase compensation filter 42 is implemented within a low power area, a Surface Acoustic Wave (SAW) filter can be used as the phase compensation filter. The advantages of the SAW filter include the relatively low cost for a high degree of control. The SAW filters utilized in the preferred embodiments are ovenized which means that they have a temperature detector and adjuster attached to them to control the temperature at all times. The maintaining of a constant temperature helps to ensure that the characteristics of the filter remain constant. Typically, a delay line is too large to ovenize. In alternative embodiments, the phase compensation filter 42 is another filter type such as distributed, cavity, lumped element LC, or lumped element coupled resonator.

Further, it is noted that the delay line 29 and the amplitude and phase adjuster 31 could be interchanged in sequence and, in particular designs, the amplitude and phase adjusters 31,34 are not essential.

Figure 7:
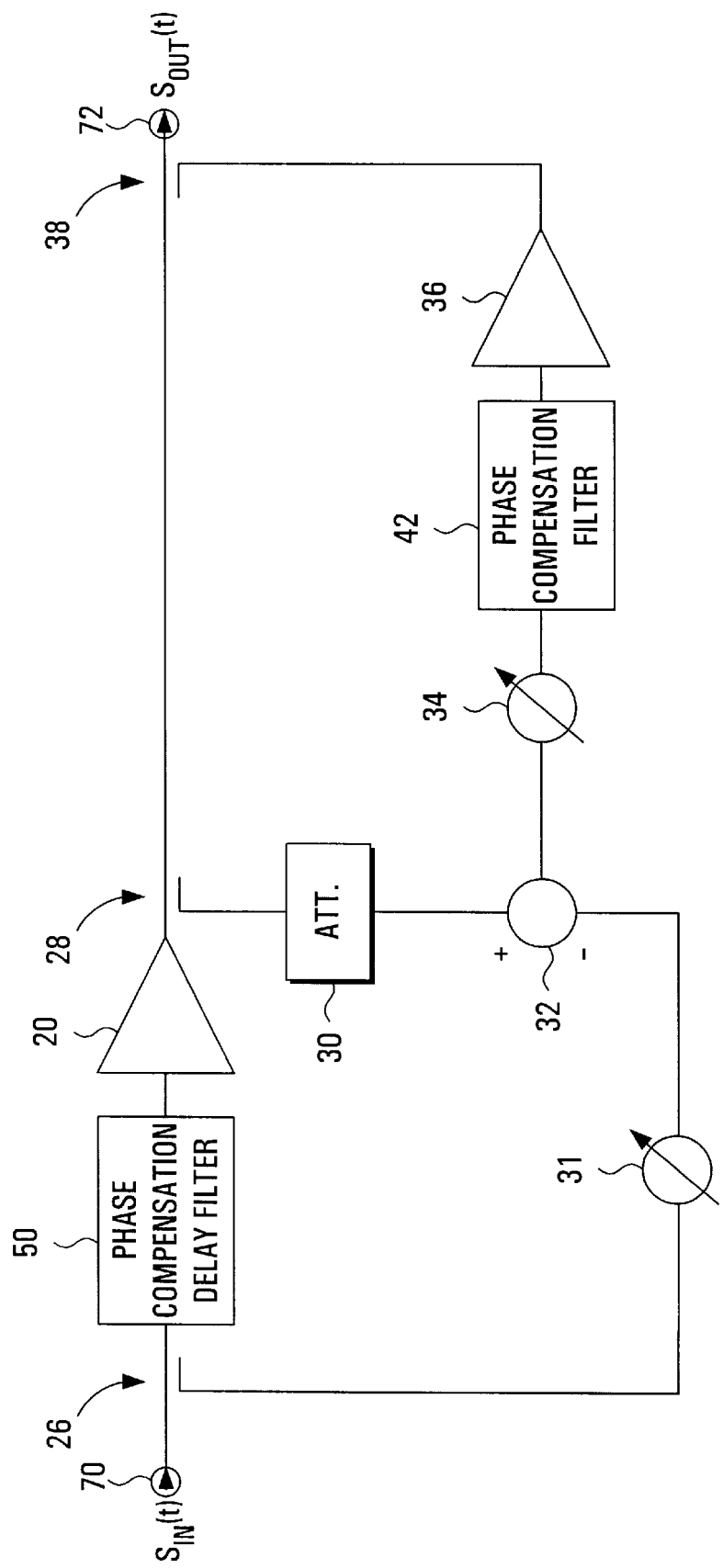
FIG. 7 is a block diagram of an alternative feed forward power amplifier configuration to that of FIG. 5.

There are numerous alternative embodiments to the preferred embodiment of the present invention depicted within FIG. 5. For one, as depicted within FIG. 7, the delay line 29 between the input sampler 26 and the amplitude and phase adjuster 31 could be removed and replaced with a phase compensation filter 50 between the input and output samplers 26,28, preferably directly prior to the main amplifier 20 in order to be placed in a low power area. In this case, the phase compensation filter 50 within a limited bandwidth preferably has a frequency versus phase characteristic of opposite slope to the main amplifier 20 and the attenuator 30. Therefore, without the use of a delay line, the inputs to the comparator 32 will remain essentially in phase over the frequency range of the filter 50 using this design. Preferably, this phase compensation filter 50 is an additional phase compensation filter to the filter 42 implemented within the feed forward error compensation path as described with reference to FIG. 5. One key advantage of implementing the phase compensation filter 50 is the removal of the delay line 29 which increases the cost and size of the overall power amplifier. Since the delay line 29 was implemented in a low power area, the removal of it will not significantly reduce the heat dissipation of the power amplifier as the removal of the delay line 40 does, however, it may reduce cost and size.

Figure 8:
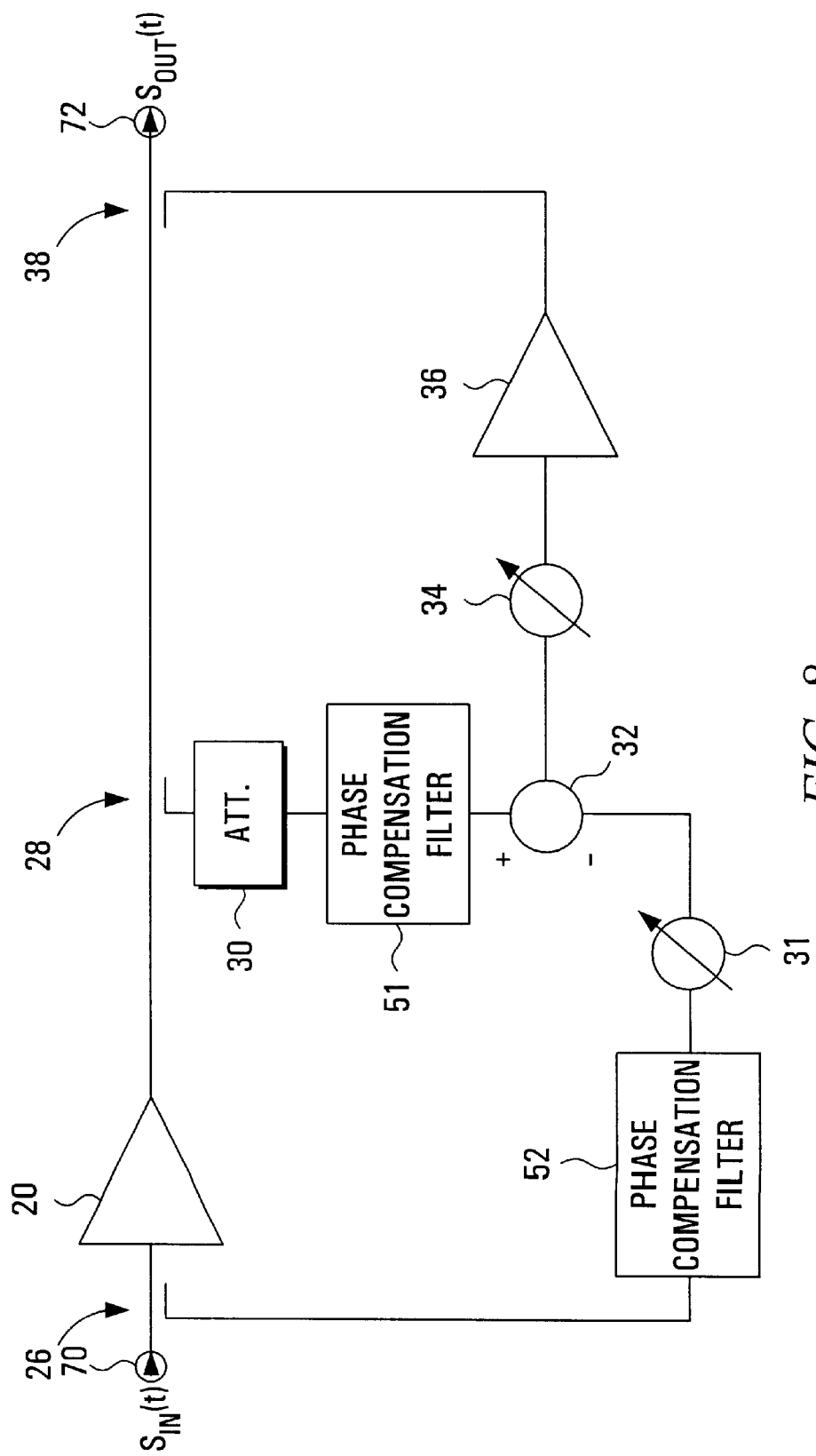
FIG. 8 is a block diagram of a first alternative feed forward power amplifier configuration to that of FIG. 5.

A further alternative embodiment of the present invention is depicted in FIG. 8. In this implementation, the phase compensation filter 42 is removed and replaced with a phase compensation filter 51 between the attenuator 30 and the comparator 32. In this case, the phase compensation filter 51, within a limited bandwidth, preferably has a frequency versus phase characteristic of approximately opposite slope to that of the attenuator 30, the comparator 32, the amplitude and phase adjuster 34 and the error amplifier 36 combined in order to compensate for the phase error caused by the delay in the error compensation path. Further, there is likely a need for a component within the power amplifier circuit of FIG. 8 to ensure that the phase error between the two inputs of the comparator 32 is not significant. In the case depicted in FIG. 8, this component is a phase compensation filter 52 between the input sampler 26 and the amplitude and phase adjuster 31, in place of the delay line 29 of FIG. 5. In this case, the phase compensation filter 52 is preferably designed to have a frequency versus phase characteristic such that the combined frequency versus phase characteristic with the amplitude and phase adjuster 31 is approximately of equal slope, in a desired bandwidth, to that of the phase compensation filter 51, the main amplifier 20, the output sampler 28 and the attenuator 30 combined. In other embodiments, this could be done by implementing a delay line between the input and output samplers 26,28, preferably prior to the main amplifier 20 so as to be implemented within a low power area.

Further, in other situations there could be a need for either a phase compensation filter coupled between the input and output samplers 26,28 similar to FIG. 5 or a delay line 29 coupled between the input sampler 26 and the comparator 32 similar to FIG. 5. These situations could occur if the frequency versus phase characteristic of the main amplifier 20, the output sampler 28, the attenuator 30 and the phase compensation filter 51 is of more negative slope within the desired bandwidth than the frequency versus phase characteristic of the amplitude and phase adjuster 31. In yet further ideal designs, it is envisioned that the phase compensation filter 51 could have a frequency versus phase characteristic sufficient to compensate for the difference in slope, within the desired bandwidth, between the inputs of the comparator 32 along with the phase compensation required for the error compensation path. It is noted that this situation would likely only occur if the power amplifier apparatus was specifically designed for this.

Figure 9:
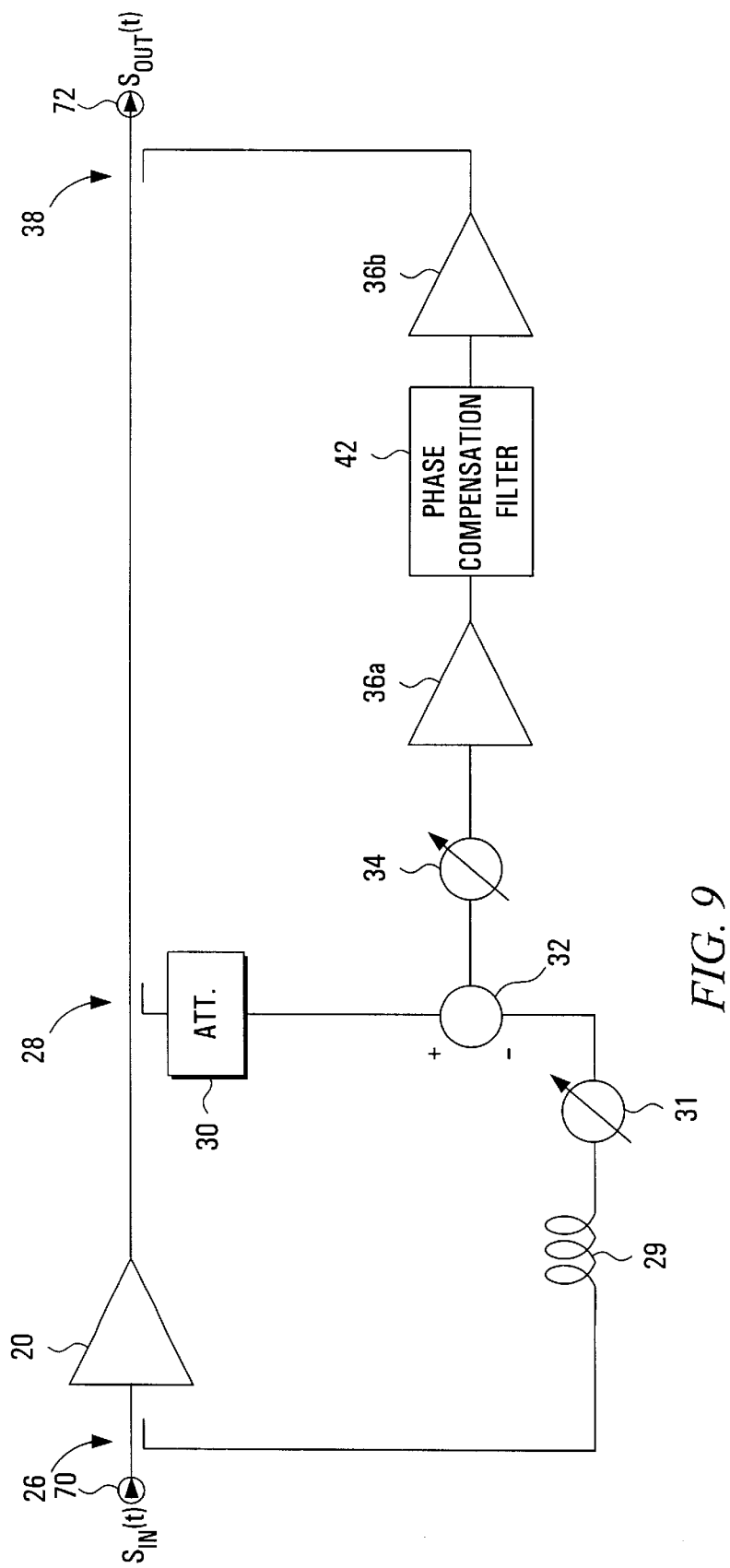
FIG. 9 is a block diagram of a second alternative feed forward power amplifier configuration to that of FIG. 5.

A yet further alternative embodiment of the present invention is depicted in FIG. 9. In this implementation, first and second error amplifiers 36a,36b are implemented on either side of the phase compensation filter 42. Preferably, each of the first and second error amplifiers 36a,36b amplify the low power error signal half of the total amplification performed by the error amplifier 36 within FIG. 5. This allows the total amplification of the low power error signal to be the same while the noise figure is possibly less since the error signal is amplified before it is contaminated with noise from the filter. If no amplification is performed before the filter 42, it could be possible that a small signal at the input of the filter 42 may be reduced by the filter itself to a level comparable to the noise at the output of the filter.

An even further alternative to the preferred embodiment depicted within FIG. 5 is to modify the configuration as a dual-loop feed forward power amplifier configuration. In this configuration, the entire power amplifier configuration depicted within any one of FIGS. 5, 7, 8 or 9 is used as a main amplifier with another feed forward error compensation path. Hence, any distortion that remains after the first error correction should be virtually completely removed after the second error correction. Preferably the second feed forward error compensation path comprises a phase compensation filter similar to that depicted within FIG. 5.

A well-known feedback power amplifier configuration will now be described with reference to FIG. 10, followed by a description of a feedback power amplifier design according to a preferred embodiment with reference to FIG. 11. The power amplifier configuration depicted within FIG. 10 comprises a main amplifier 20, input and output nodes 70,72, input and output samplers 26,28, a delay line 29, an amplitude and phase adjuster 31 and an attenuator 30, each of which are in a similar setup as the power amplifier configuration depicted within FIG. 3. One key difference in this design is that the outputs from the attenuator 30 and the amplitude and phase adjuster 31 are input to a comparator 54 which compares various aspects of these inputs to generate a plurality of distortion error signals. These aspects can include, but are not limited to, slowly varying phase distortion, fast varying phase distortion, slowly varying amplitude distortion, fast varying amplitude distortion, in phase distortion and/or quadrature distortion.

Figure 10:
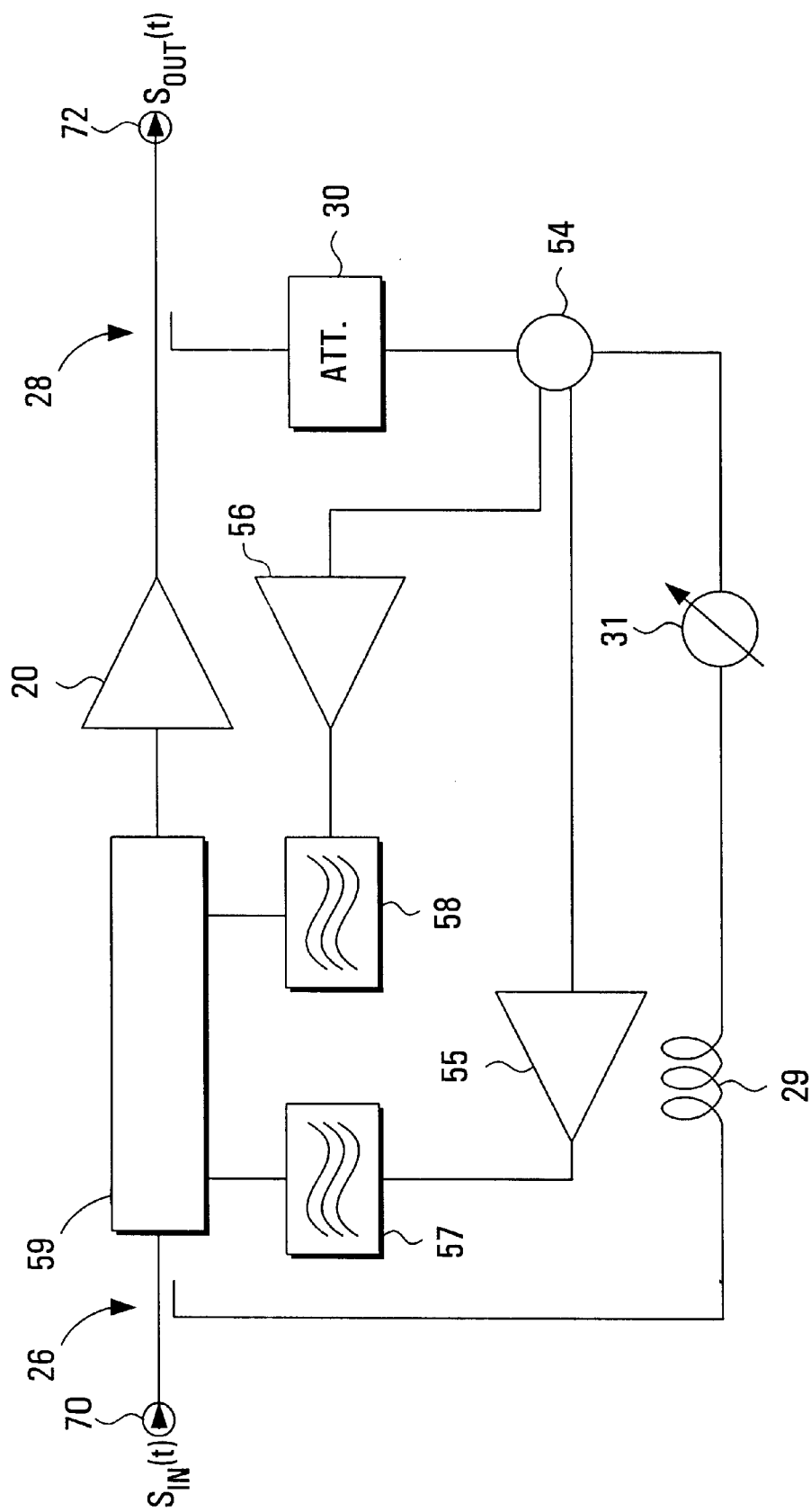
FIG. 10 is a block diagram of a well-known feedback power amplifier configuration.

In the simplified case depicted in FIG. 10, the phase and amplitude are being compared within the comparator 54 which is essentially two comparators in this case that produce a phase error signal that at is input to amplifier 55 and an amplitude error signal that is input to amplifier 56. Further, the outputs of amplifiers 55,56 are input to filters 57,58 respectively that could be low pass or bandpass filters or alternatively could be integrator circuits. These filters 57,58 have filtered outputs controlling an adjuster circuit 59 that is coupled between the input sampler 26 and the input to the main amplifier 20. This control before the main amplifier 20 causes the existence of a phase control loop comprised of the components 20, 28, 30, 54, 55, 57 and 59, and an amplitude control loop comprised of the components 20, 28, 30, 54, 56, 58 and 59, these loops imposing design constraints. In other typical feedback power amplifier configurations there may be even further control loops as mentioned above.

It is noted that the error amplifiers 55,56 within the power amplifier configuration of FIG. 10 typically have a lower output power than the error amplifier 36 of FIG. 3. This reduction in power between the error amplifiers 36 and 55,56 is due to the amplified error signals within FIG. 10 not requiring to be of high power since they are used for control within a low power area of the power amplifier configuration, that is they control the signal before the main amplifier 20 amplifies it.

Within FIG. 10, each control loop is designed so that if the loop were broken, between one of the filters 57,58 and the adjuster 59, a first signal varying at some frequency which lies within a certain range of frequencies input to the adjuster 59 would result in a larger signal, nearly in antiphase, being returned at the output of the particular filter 57,58. The purpose of filters 57,58 of FIG. 10 is to limit the amplitude of signals outside the above mentioned frequency range, so that signals which lie in a frequency range where the returned signal is in phase with the first signal, or nearly so, are much reduced in amplitude compared to the first signal. The effect of filters 57,58 is to prevent oscillations, ringing and noise enhancements which are all distortions of the desired signal which cannot be tolerated.

Distortions of the desired signal which vary at a rate lying within the first frequency range mentioned above, wherein the returned signal is in antiphase and much larger than the first signal will be removed by the action of the loop when the control loops are closed by connecting the filters 57,58 to adjuster 59. It should be noted that the action of filters 57,58, while preventing oscillation over a certain range of frequency, also prevents correction over an even larger range of frequencies hence limiting the bandwidth of frequencies in which the distortions can be corrected for.

It should further be noted that all the elements of the above described control loops have some delay, the overall delay having the effect of decreasing the phase of the returned error signals. The effect of the delay increases as the frequency increases. Thus, control loops which have more delay require filters with narrower bandwidths, as the 360° threshold will be approached at a lower frequency.

A feedback power amplifier configuration according to a preferred embodiment of the present invention is now described with reference to FIG. 11. In this embodiment, a phase compensation filter 60 is inserted between the output sampler 28 and the comparator 54, the phase compensation filter possibly being implemented either before or after the attenuator 30; the attenuator 30 not being required if the filter 60 was implemented with the required loss. This phase compensation filter 60 preferably has a frequency versus phase characteristic similar to that seen on the first curve 44 within FIG. 6, and a constant frequency versus gain characteristic. Within the bandwidth Δf, in which the phase increases with an increase in frequency, the lag is partially compensated for. Hence, the frequency range of stable operation is expanded, as it takes a larger frequency to cause a lag of 360°. This allows the bandpass filters 57,58 to be designed with greater bandwidths as the range of frequencies over which the change of phase for the returned signal is within 90° of antiphase increases. Yet a further advantage of this configuration is that the delay line 29 can be greatly reduced in size or eliminated depending on the phase compensation characteristic of the phase compensation filter 60.

Presently, the feed forward configuration depicted in FIG. 3 is utilized significantly more than the feedback configuration, due to the extreme limitation on bandwidth of the feedback configuration as described previously. With the expansion of the bandwidth for the feedback configuration depicted in FIG. 11, the usefulness of the feedback power amplifier increases. There are advantages to the feedback configuration when compared to the feed forward configuration described previously. One key advantage is the smaller error amplifier required due to the error signal being inserted within a low power area rather than at a high power area such is the case within the feed forward error compensation path. This reduces the cost of the error amplifier itself and further reduces the expenses due to the additional DC supply power and heat dissipation that is required for a higher gain amplifier.

As described previously for the feed forward power amplifier configuration depicted within FIG. 5, the phase compensation filter 60 is preferably a SAW filter and is further a SAW filter that has been ovenized. Alternatively, the phase compensation filter 60 maybe another type of filter such as distributed, cavity, lumped element LC, or lumped element coupled resonator.

Figure 11:
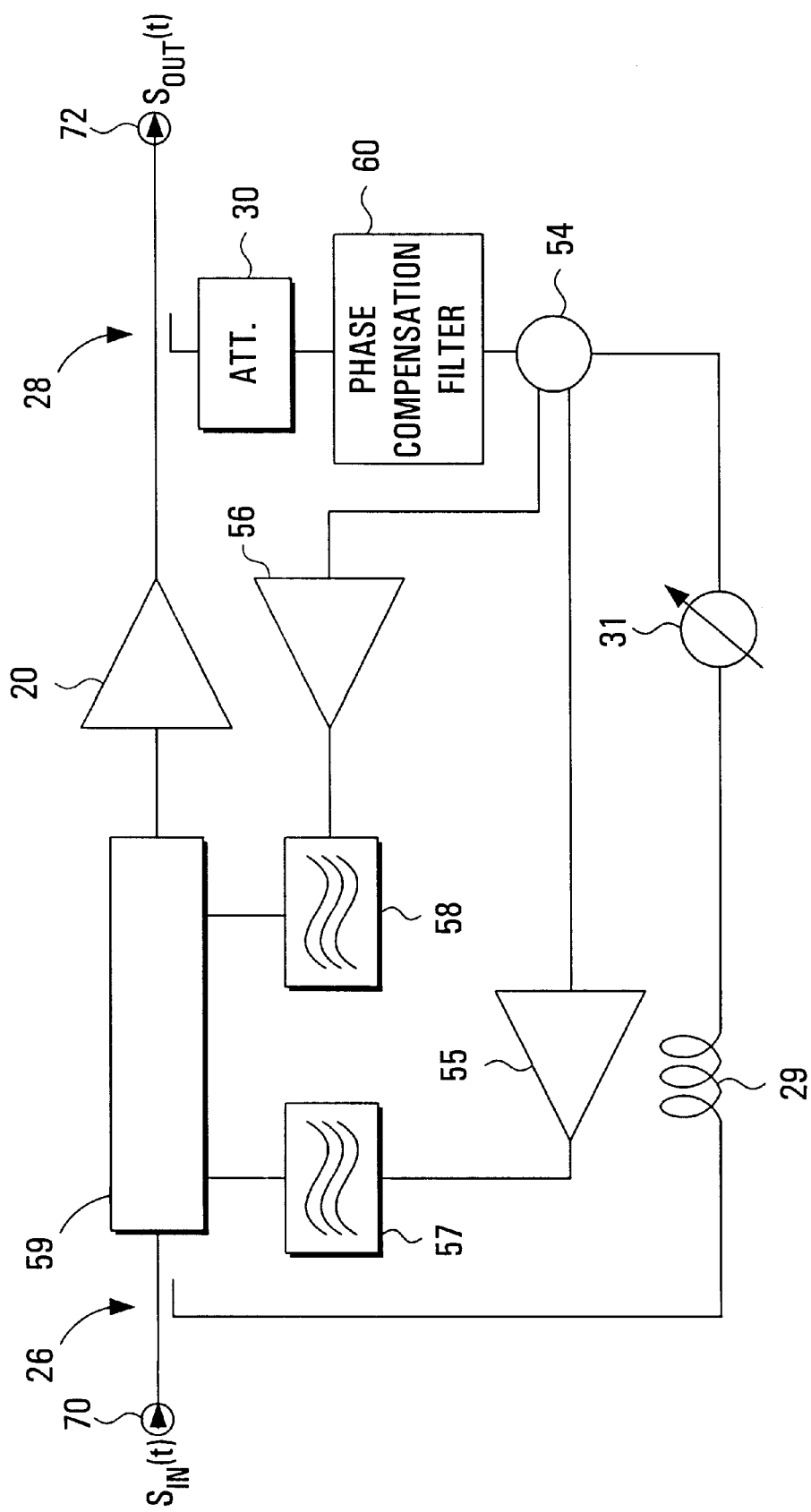
FIG. 11 is a block diagram of a feedback power amplifier configuration according to a preferred embodiment of the present invention.
Figure 12:
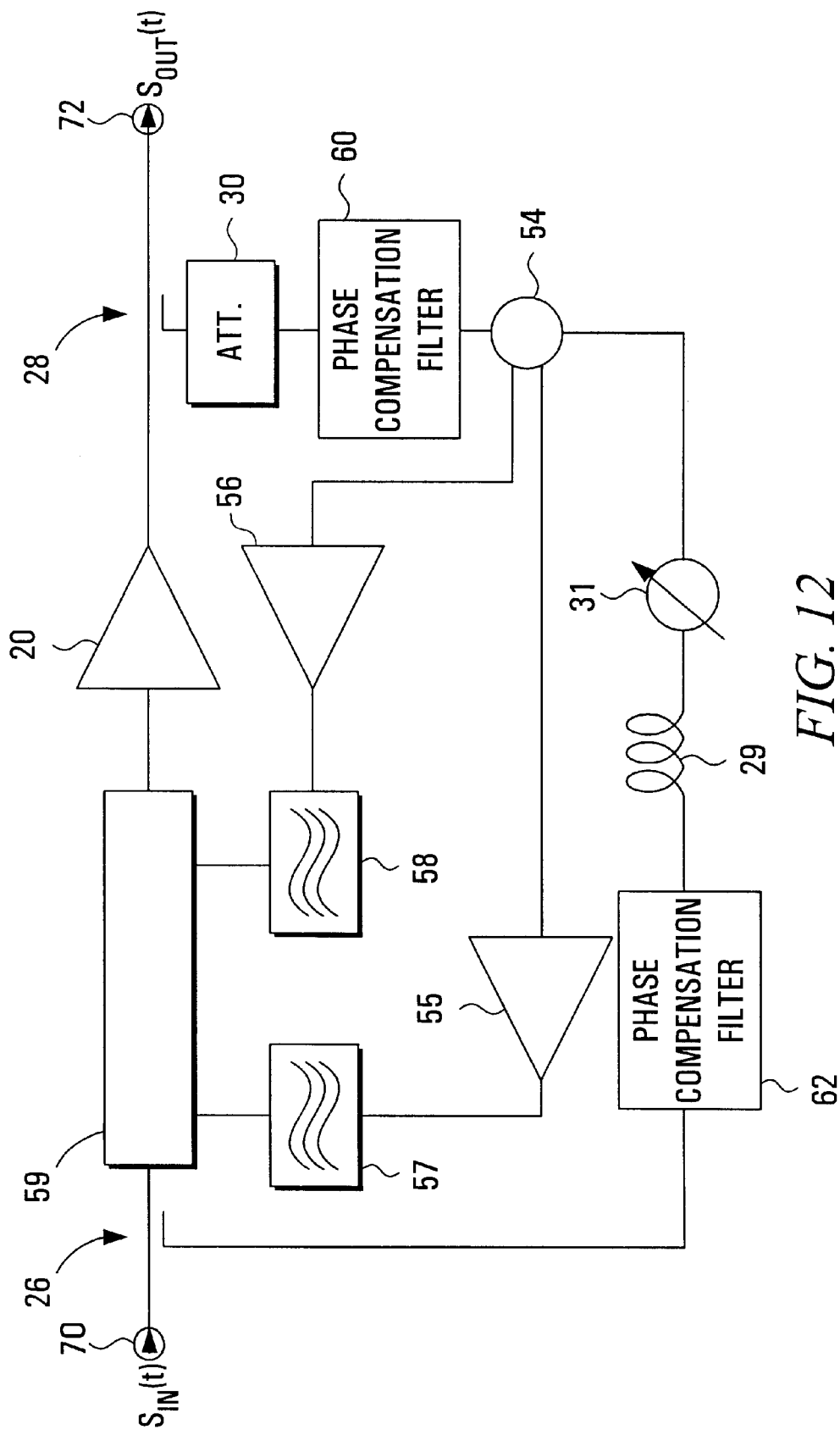
FIG. 12 is a block diagram of a first alternative feedback power amplifier configuration to that of FIG. 11.

One alternative embodiment to the feedback power amplifier configuration depicted within FIG. 11 is now described with reference to FIG. 12. In this figure, the delay line 29 has been retained at its original length as would be used in FIG. 9 and a second phase compensation filter 62, identical to filter 60, has been inserted between the input sampler 26 and the delay line 29. In this embodiment, the first and second samples arrive at the comparator 54 with very similar time delay, phase shift and amplitude, and hence, a very exact measurement of the distortion is possible. This improvement may allow more exact correction and lower distortion at the expense of a longer delay line. The mitigating factor is that this delay line 29 operates at low power and hence is cheaper as its design and construction are less onerous.

Figure 13:
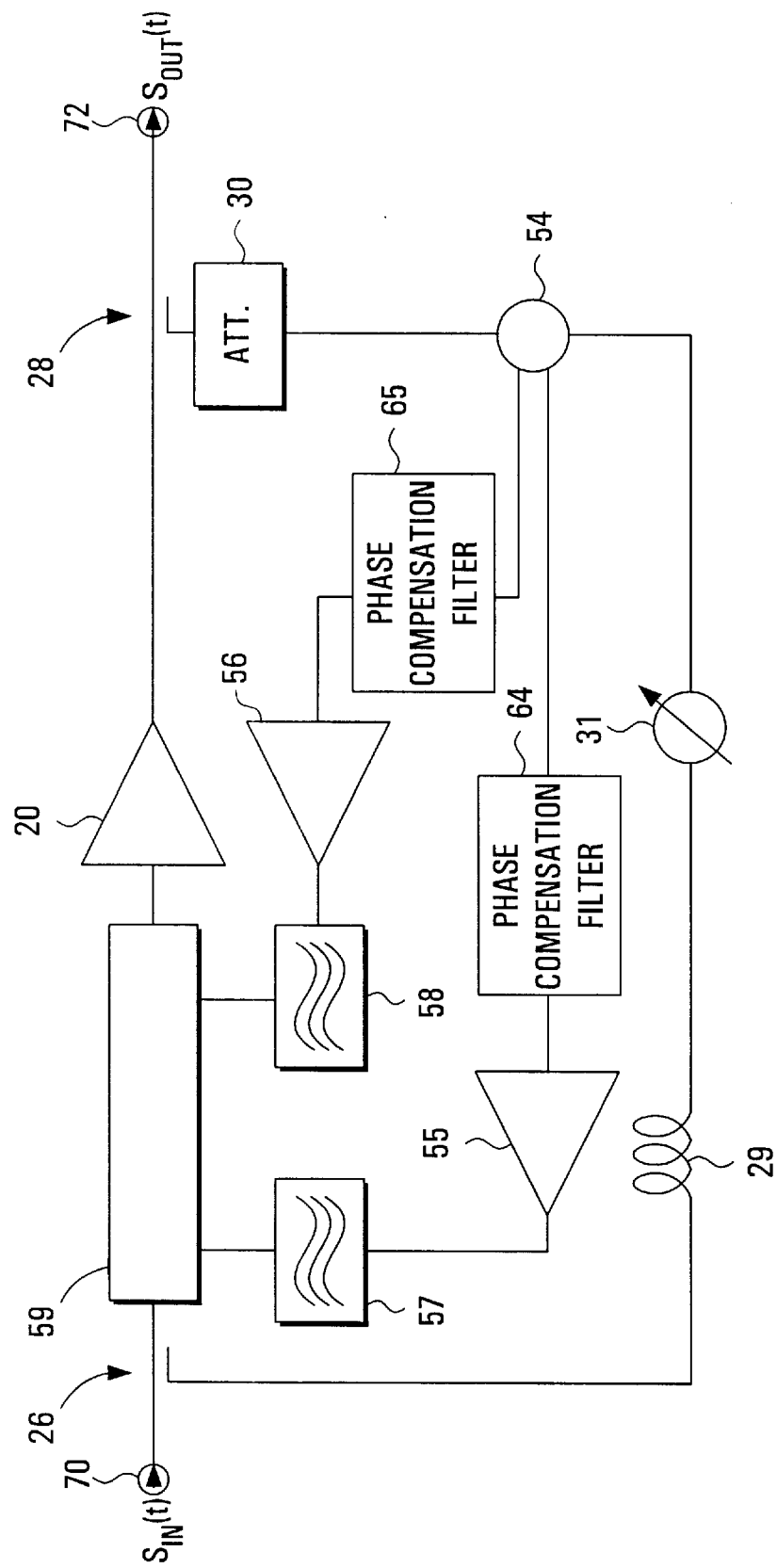
FIG. 13 is a block diagram of a second alternative feedback power amplifier configuration to that of FIG. 11.

It is noted that, similar to the feed forward power amplifier configuration, the phase compensation filter 60 could be located in a different location within the feedback error compensation path. In some alternative embodiments, the phase compensation filter 60 is inserted prior to attenuator 30 or prior to the main amplifier 20. In yet other alternative embodiments of the feedback configuration of the present invention, the phase compensation filter 60 can be removed from between the attenuator 30 and the comparator 54 and be replaced with one or more phase compensation filters between the comparator 54 and the adjuster 59. As depicted in FIG. 13, phase compensation filters 64,65 are implemented between the comparator 54 and the error amplifiers 55,56 respectively. In other embodiments, the phase compensation filters 64,65 could be implemented between the error amplifiers 55,56 and the bandpass filters 57,58 and/or between the bandpass filters 57,58 and the adjuster 59.

There are yet further implementations of a power amplifier apparatus with a feedback error compensation path according to preferred embodiments of the present invention. For instance, there are embodiments of the present invention in which the filters 57,58 and/or the amplitude and phase adjuster 31 are not included due to the design constraints of the power amplifier apparatus. Further, there are alternatives in which the components of the power amplifier apparatus are in a different sequence. For instance, the phase compensation filter 62, the delay line 29 and the amplitude and phase adjuster 31 of FIG. 12 could be in another order. Yet further, this apparatus could have one or two (as shown in FIGS. 11 and 12) or more than two feedback paths, each feedback path comprising a comparator, an error amplifier and preferably a filter (low pass filter, bandpass filter or integrator).

It is further noted that there could be further components in any one of the above described embodiments. For instance, filters are commonly implemented within power amplifier apparatus to reduce undesired characteristics of other components. It is noted that these filters could be combined with one or more of the components that are described herein. For instance, as described above for the feed forward implementation, phase compensation filters implemented within either the feedback or feed forward configurations can have a frequency versus gain characteristic that compensates for other components within the error compensation path. In cases where such compensation is not required, the phase compensation filters preferably have a substantially constant frequency versus gain characteristic.

Persons skilled in the art will appreciate that there are yet more alternative implementations and modifications possible for implementing the present invention, and that the above implementation is only an illustration of this embodiment of the invention. The scope of the invention, therefore, is only to be limited by the claims appended hereto.

What is claimed is:

1. A power amplifier apparatus comprising:
    a main amplifier comprising an input and an output, the main amplifier amplifying signals that are received at the input while adding distortion components;
    first and second samplers, coupled to the input and output of the main amplifier respectively, that generate first and second samples respectively;
    a comparator, coupled to the first and second samplers, that generates an error signal in response to the first and second samples;
    a filter, coupled to the comparator, that filters the error signal, the filter having a frequency versus phase characteristic with a positive slope over a limited bandwidth;
    an error amplifier, coupled to the filter, that amplifies the filtered error signal; and
    an injector, coupled to the error amplifier and the output of the main amplifier, that combines a signal at the output of the main amplifier with the amplified error signal to generate an output signal for the power amplifier apparatus.

2. A power amplifier apparatus according to claim 1 further comprising a delay apparatus, coupled between the first sampler and the comparator, that receives the first sample and outputs a delayed first sample; and an attenuator, coupled between the second sampler and the comparator, that receives the second sample, reduces the power of the second sample, and outputs a low power second sample; and
    wherein the comparator compares the low power second sample with the delayed first sample to generate the error signal.

3. A power amplifier apparatus according to claim 2 further comprising an amplitude and phase adjuster, coupled between the first sampler and the comparator, that adjusts the amplitude and phase of the first sample to be substantially in antiphase with non-distortion components within the low power second sample.

4. A power amplifier apparatus according to claim 2, wherein the delay apparatus is one of a delay line and a delay filter.

5. A power amplifier apparatus according to claim 1 further comprising a second filter, coupled between the output of the main amplifier and the second sampler, that has a frequency versus phase characteristic with a positive slope over a limited bandwidth;
    wherein the error compensation loop further comprises an attenuator, coupled between the second sampler and the comparator, that receives the second sample, reduces the power of the second sample, and outputs a low power second sample; and
    wherein the comparator compares the low power second sample with the first sample to generate the error signal.

6. A power amplifier apparatus according to claim 1 further comprising a second filter, coupled between the first sampler and the input of the main amplifier, that has a frequency versus phase characteristic with a positive slope over a limited bandwidth;
    wherein the error compensation loop further comprises an attenuator, coupled between the second sampler and the comparator, that receives the second sample, reduces the power of the second sample, and outputs a low power second sample; and
    wherein the comparator compares the low power second sample with the first sample to generate the error signal.

7. A power amplifier apparatus according to claim 6 further comprising an amplitude and phase adjuster, coupled between the first sampler and the comparator, that adjusts the amplitude and phase of the first sample to be substantially in antiphase with non-distortion components within the low power second sample.

8. A power amplifier apparatus according to claim 1 further comprising an amplitude and phase adjuster, coupled between the comparator and the injector, that adjusts the amplitude and phase of the error signal to be substantially in antiphase with the distortion components of a signal at the output of the main amplifier.

9. A power amplifier apparatus according to claim 1 further comprising a second error amplifier coupled between the comparator and the filter that amplifies the error signal.

10. A power amplifier apparatus according to claim 1, wherein the filter is a Surface Acoustic Wave filter.

11. A power amplifier apparatus according to claim 10, wherein the filter further comprises a temperature detector and adjuster to maintain the filter at a constant temperature.

12. A power amplifier apparatus according to claim 1, wherein the frequency versus gain characteristic for the filter results in a substantially constant frequency versus gain characteristic for the amplified error signal.

13. A power amplifier apparatus comprising:
    a main amplifier comprising an input and an output, the main amplifier amplifying signals that are received at the input while adding distortion components;
    first and second samplers, coupled to the input and output of the main amplifier respectively, that generate first and second samples respectively;
    a comparator, coupled to the first and second samplers, that generates an error signal in response to the first and second samples;
    an error amplifier, coupled to the comparator, that amplifies the error signal;
    a filter, coupled to the comparator, that filters the amplified error signal, the filter having a frequency versus phase characteristic with a positive slope over a limited bandwidth; and
    an injector, coupled to the filter and the output of the main amplifier, that combines a signal at the output of the main amplifier with the filtered error signal to generate an output signal for the power amplifier apparatus.

14. A power amplifier apparatus comprising:
- a main amplifier comprising an input and an output, the main amplifier amplifying signals that are received at the input while adding distortion components;
- first and second samplers, coupled to the input and output of the main amplifier respectively, that generate first and second samples respectively;
- a filter, coupled to the second sampler, that filters the second sample, the filter having a frequency versus phase characteristic with a positive slope over a limited bandwidth;
- a comparator, coupled to the first sampler and the filter, that generates an error signal in response to the first sample and the filtered second sample;
- an error amplifier, coupled to the comparator, that amplifies the error signal; and
- an injector, coupled to the error amplifier and the output of the main amplifier, that combines a signal at the output of the main amplifier with the amplified error signal to generate an output signal for the power amplifier apparatus.

15. A power amplifier apparatus according to claim 14 further comprising a second filter, coupled between the first sampler and the comparator, that receives the first sample and outputs a filtered first sample, the second filter having a frequency versus phase characteristic with a positive slope over a limited bandwidth.

16. A power amplifier apparatus according to claim 14 further comprising a delay apparatus, coupled between the first and second samplers.

17. A power amplifier apparatus according to claim 14 further comprising a second filter, coupled between the first and second samplers, the second filter having a frequency versus phase characteristic with a positive slope over a limited bandwidth.

18. A power amplifier apparatus according to claim 14 further comprising a delay apparatus, coupled between the first sampler and the comparator, that receives the first sample and outputs a delayed first sample.

19. A power amplifier apparatus according to claim 14 further comprising an attenuator, coupled between the second sampler and the comparator, that receives the second sample, reduces the power of the second sample and outputs a low power second sample.

20. A power amplifier apparatus comprising:
- a main amplifier comprising an input and an output, the main amplifier amplifying signals that are received at the input while adding distortion components;
- first and second samplers, coupled to the input and output of the main amplifier respectively, that generate first and second samples respectively;
- a phase compensation filter, coupled to the second sampler, that filters the second sample, the filter having a frequency versus phase characteristic with a positive slope over a limited bandwidth;
- a comparator, coupled to the first sampler and the filter, that generates an error signal in response to the first sample and the filtered second sample;
- an error amplifier, coupled to the comparator, that amplifies the error signal; and
- an adjuster, coupled to the error amplifier and the first sampler, that adjusts a signal at the input of the main amplifier in response to the amplified error signal.

21. A power amplifier apparatus according to claim 20, wherein the error signal generated at the comparator is representative of a phase difference between the first sample and the filtered second sample.

22. A power amplifier apparatus according to claim 20, wherein the error signal generated at the comparator is representative of an amplitude difference between the first sample and the filtered second sample.

23. A power amplifier apparatus according to claim 20 further comprising:
- a second comparator, coupled to the first sampler and the filter, that generates a second error signal in response to the first sample and the filtered second sample;
- a second error amplifier, coupled to the second comparator, that amplifies the second error signal; and
- wherein the adjuster further adjusts a signal at the input of the main amplifier in response to the second error signal.

24. A power amplifier apparatus according to claim 23, wherein the first and second error signals generated at the respective first and second comparators is representative of a slowly varying and fast varying amplitude difference respectively between the first sample and the filtered second sample.

25. A power amplifier apparatus according to claim 23, wherein the first and second error signals generated at the respective first and second comparators is representative of a slowly varying and fast varying phase difference respectively between the first sample and the filtered second sample.

26. A power amplifier apparatus according to claim 23, wherein the first and second error signals generated at the respective first and second comparators is representative of an in phase and quadrature difference respectively between the first sample and the filtered second sample.

27. A power amplifier apparatus according to claim 20 further comprising a delay apparatus, coupled between the first sampler and the comparator, that receives the first sample and outputs a delayed first sample; and an attenuator, coupled between the second sampler and the filter, that receives the second sample, reduces the power of the second sample, and outputs a low power second sample to the filter; and
- wherein the comparator compares the low power second sample output from the filter with the delayed first sample to generate the error signal.

28. A power amplifier apparatus according to claim 27, wherein the delay apparatus is one of a delay line and a delay filter.

29. A power amplifier apparatus according to claim 27 further comprising a second filter, coupled between the first sampler and the comparator, that has a frequency versus phase characteristic with a positive slope over a limited bandwidth.

30. A power amplifier apparatus according to claim 20 further comprising an amplitude and phase adjuster, coupled between the first sampler and the comparator, that adjusts the amplitude and phase of the first sample to be substantially in antiphase with the second sample.

31. A power amplifier apparatus according to claim 20, wherein the filter is a Surface Acoustic Wave filter.

32. A power amplifier apparatus according to claim 21, wherein the filter further comprises a temperature detector and adjuster to maintain the filter at a constant temperature.

33. A power amplifier apparatus according to claim 20 further comprising a bandpass filter, coupled between the error amplifier and the adjuster, that bandpass filters the amplified error signal prior to it being input to the adjuster.

34. A power amplifier apparatus according to claim 20 further comprising a low pass filter, coupled between the error amplifier and the adjuster, that low pass filters the amplified error signal prior to it being input to the adjuster.

35. A power amplifier apparatus according to claim 20 further comprising an integrator circuit, coupled between the error amplifier and the adjuster, that filters the amplified error signal prior to it being input to the adjuster.

36. A power amplifier apparatus according to claim 20, wherein the frequency versus gain characteristic for the filter results in a substantially constant frequency versus gain characteristic for the amplified error signal.

* * * * *